(12) United States Patent
Froment et al.

(10) Patent No.: US 6,627,093 B1
(45) Date of Patent: Sep. 30, 2003

(54) METHOD OF MANUFACTURING A VERTICAL METAL CONNECTION IN AN INTEGRATED CIRCUIT

(75) Inventors: Benoit Froment, Crolles (FR); Phillipe Gayet, Saint Vincent de Mercure (FR); Erik Van Der Vegt, Grenoble (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/673,203

(22) PCT Filed: Feb. 4, 2000

(86) PCT No.: PCT/EP00/00884
§ 371 (c)(1),
(2), (4) Date: Oct. 12, 2000

(87) PCT Pub. No.: WO00/48246
PCT Pub. Date: Aug. 17, 2000

(30) Foreign Application Priority Data

Feb. 12, 1999 (FR) .............................................. 9901741

(51) Int. Cl.[7] .......................... H01L 21/00; H01B 13/00
(52) U.S. Cl. .............................. 216/18; 216/17; 216/41; 216/79; 216/13; 438/720; 438/723; 438/687
(58) Field of Search .............................. 216/13, 17, 18, 216/41, 79; 438/720, 723, 724, 622–688

(56) References Cited

U.S. PATENT DOCUMENTS

| | | | | | |
|---|---|---|---|---|---|
| 5,741,626 | A | * | 4/1998 | Jain et al. | 430/314 |
| 5,817,572 | A | * | 10/1998 | Chiang et al. | 438/624 |
| 5,818,069 | A | * | 10/1998 | Kadosh et al. | 257/67 |
| 6,093,627 | A | * | 7/2000 | Sung | 438/586 |
| 6,265,313 | B1 | * | 7/2001 | Huang et al. | 438/639 |

FOREIGN PATENT DOCUMENTS

FR WO 01/20665 * 3/2001

* cited by examiner

Primary Examiner—Benjamin L. Utech
Assistant Examiner—Shamim Ahmed
(74) Attorney, Agent, or Firm—Aaron Waxler

(57) ABSTRACT

At least one layer of a dielectric material 3 is deposited on a copper track 1 covered with an encapsulation layer 2. A cavity 6 is etched in the layer of dielectric material at the location of the future vertical connection. At least one protective layer is deposited in said cavity to preclude diffusion of copper 7. The protective layer 7 at the bottom of the cavity 6 is subjected to an anisotropic etching treatment and also the encapsulation layer 2 is subjected to etching, whereafter the cavity is filled with copper. The copper particles pulverized during etching the encapsulation layer do not contaminate the dielectric material 3.

4 Claims, 3 Drawing Sheets

METHOD OF MANUFACTURING A VERTICAL METAL CONNECTION IN AN INTEGRATED CIRCUIT

BACKGROUND OF THE INVENTION

The invention relates to the manufacture of integrated circuits, more particularly the making of vertical metal connections (commonly referred to as "vias" by those skilled in the art) using a "damascene" type process, as it is called by those skilled in the art.

A damascene process may be carried out in a number of alternative ways, such as, in particular, the variant referred to as "single damascene", or the variant referred to as "autoaligned dual damascene", or the variant referred to as "inverse dual damascene".

In the variant referred to as "single damascene", the via is formed by making a cavity in the dielectric material deposited between two metallization levels of the integrated circuit, whereafter the cavity is filled with a metal.

In the variant referred to as "autoaligned dual damascene", the cavities of the vias to be formed and the cavities of the future tracks of the upper metallization level are simultaneously etched. Next, all these cavities will be filled with a filling metal to form the vias and the tracks of the upper metallization levee In this variant, the inter-level dielectric material (that is, the dielectric material situated between two adjacent metallization levels) and the inter-track dielectric material situated at-the metallization level n+1 (that is, the dielectric material situated at the level n+1 between the tracks of this level) are separated by a stop layer, which is typically made of silicon nitride.

The variant referred to as "inverse dual damascene" differs from the "autoaligned dual damascene" variant in that in the former variant it is possible to omit the silicon nitride layer between the inter-level dielectric material and the inter-track dielectric material.

It proved to be very interesting to use copper for the metal tracks of one metallization level because copper has a better conductivity than, for example, aluminum. Meanwhile, the use of such a material is very tricky because there is a risk of diffusion of copper atoms into the dielectric materials, which might cause leakage currents between vias or between metal tracks. In addition, the copper may diffuse to the transistors and have an adverse effect on the functioning thereof.

The invention particularly relates to conductive materials, notably copper but also gold or alloys thereof, which diffuse or migrate into the dielectric materials and, more generally, into all materials used in microelectronics.

SUMMARY OF THE INVENTION

It is an object of the invention, in particular, to provide integrated circuits having metallization levels of copper, using a damascene-type process to make the vias of the integrated circuit, while precluding the diffusion of copper particles into the dielectric materials.

The invention applies to all types of damascene processes, more particularly to the variants mentioned hereinabove.

This object is achieved, in accordance with the invention, by a method of manufacturing a vertical metal connection which is supported by a portion of a metallization level of an integrated circuit.

Said portion being made of a conductive material (for example copper) and covered with an encapsulation layer, (e.g. of silicon nitride), said method includes, in accordance with a general characteristic of the invention, the deposition on said conductive portion thus covered of at least a layer of a dielectric material (typically ethyl tetraorthosilicate), whereafter the layer of dielectric material is etched so as to form a cavity at the location of the future vertical connection. The method further includes the deposition of at least one protective layer in said cavity to preclude diffusion of the conductive material, whereafter the protective layer at the bottom of the cavity is anisotropically etched, and the encapsulation layer is also etched, after which the cavity is filled with a conductive filler material, such as copper, aluminium, tungsten.

In practice, a single protective layer is used when a "single damascene" or "autoaligned dual damascene" type process is carried out. On the other hand, when in accordance with the invention, an "inverse dual damascene" type process is used, the process in accordance with the invention advantageously includes, after the protective layer and the encapsulation layer at the bottom of the cavity have been etched, the deposition of a second protective layer at the bottom and on the walls of the cavity. This enables direct contact between the copper (for example) and the dielectric material to be avoided at the level of the intermediate, horizontal plane of the cavity. Therefore, the possibility of depositing a second protective layer can be considered in all damascene processes where there is a risk of direct contact between the copper and the dielectric material.

The protective layer is advantageously composed of a material selected particularly from the group formed by tantalum, tantalum nitride, titanium and titanium nitride.

Thus, in accordance with the invention, the contaminating elements of copper, resulting from etching the encapsulation layer, are situated on the right side of the protective layer, i.e. they do not contact the dielectric material.

Thus, the method in accordance with the invention protects the oxide from contamination by copper and enables a cleaning step using chemical agents to eliminate the contaminating copper particles to be omitted.

Furthermore, the absence of the barrier layer at the bottom of the via enables a sizeable reduction of the resistance of the via when a single protective layer is deposited.

These and other aspects of the invention will be apparent from and elucidated with reference to the embodiment(s) described hereinafter by way of non-limitative example.

Figure 1A:
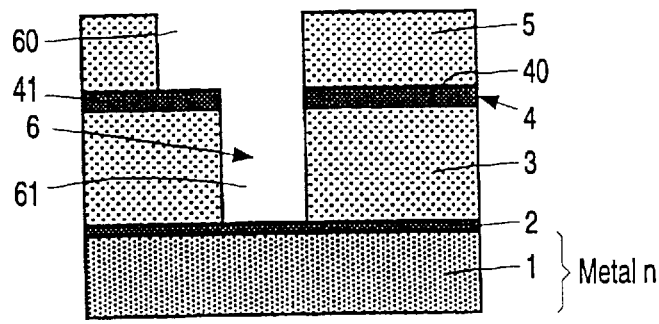
FIGS. 1a through 1d illustrate a method of carrying out the process in accordance with the invention, which can be used more particularly for an "autoaligned dual damascene" process.
Figure 1B:
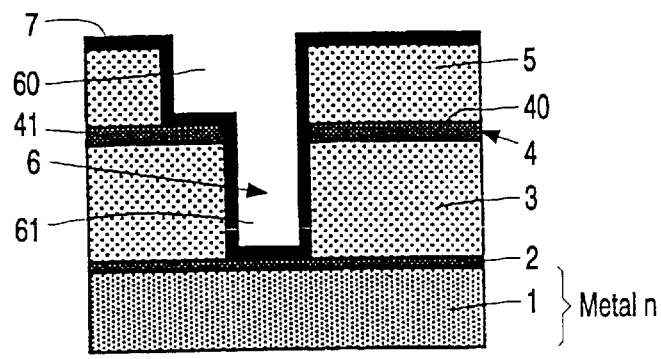
Figure 1C:
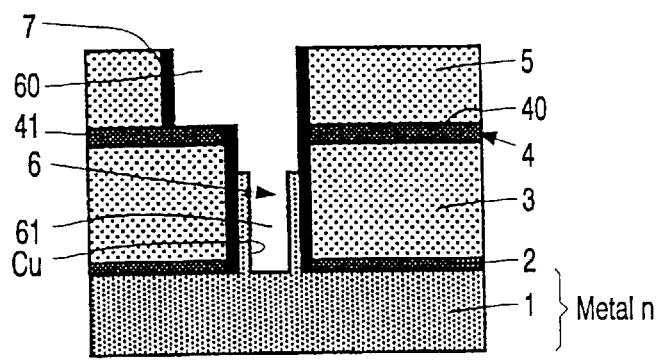

Before giving a more detailed description of the method of carrying out the process shown in the FIGS. 1a through 1d, the preliminary steps of the "autoaligned dual damascene" process which have led to the structure shown in FIG. 1a are briefly described.

An encapsulation layer, typically of silicon nitride SiN, having a thickness of, for example, 40 nm is deposited on a metallization level (for example the metal level n) formed by copper tracks separated from each other by a dielectric material. Next, an inter-level dielectric material is deposited, for example of ethyl tetraorthosilicate (Si(OC$_2$H$_5$)$_4$; TEOS in English). The inter-level dielectric layer typically has a thickness of 800 nm. Subsequently, a 120 nm thick stop layer, typically of silicon nitride SiN, is deposited on this layer of dielectric material. Next, the stop layer is locally etched using a specific mask to define the location of the vias to be formed.

In the next stage, another layer of a dielectric material, for example also ethyl tetraorthosilicate, is deposited, said layer forming the inter-track dielectric material, i.e. it separates the metal tracks of the metallization level n+1 from each other.

To be more precise, by means of another specific mask, the second layer of dielectric material is locally etched down to the silicon nitride stop layer in such a manner that cavities are formed which extend only in said second layer of dielectric material at the location of certain tracks to be formed at the metallization level n+1. Moreover, in the regions which are free of stop layers, the etching process does not only include the second dielectric layer but also the first dielectric layer so as to form a cavity whose upper part is used, after it has been filled, to form a metal track at the metallization level n+1, and whose lower part (autoaligned with the upper part) serves, after metallization, to form a via, resulting in the formation of the metal connection between a track at the level n and the track at the level n+1. The encapsulation layer is used, on the one hand, to avoid inter-level contamination of the dielectric material by the copper of the level n and, on the other hand, as a stop layer for etching the cavity.

DESCRIPTION OF THE PREFERRED EMBODIMENTS

FIG. 1a shows a part of the integrated circuit after the dielectric layers have been etched. To be more precise, in FIG. 1a, reference numeral 1 refers to a portion of the copper track at the metal level n, covered with the encapsulation layer 2. This FIG. 1a also shows the stack formed by the first inter-level dielectric material 3, the stop layer of silicon nitride 4 and the second layer of dielectric material 5, which is an inter-track layer. Etching of the stop layer 4 has locally led to two portions 40 and 41, and the subsequent etching of the dielectric materials has led to the cavity 6 having an upper part 60 which is larger (or longer) than the lower part 61.

In accordance with the invention, a protective layer 7 consisting of a material which forms a barrier with respect to the diffusion of copper particles (FIG. 1b) is subsequently deposited on the structure obtained in FIG. 1a. To be more precise, said layer 7 may be a layer of titanium nitride TiN having a thickness of several tens of nanometers, for example 25 nm.

Subsequently, (FIG. 1c) said protective layer is subjected to a first anisotropic etching treatment. This etching treatment is, for example, a plasma-etching treatment using chlorinated or fluoridated ions diluted in argon. As a result of this anisotropic etching operation, the titanium nitride remains on the vertical walls of the cavity 6.

Next, the silicon nitride encapsulation layer 2 is subjected to an etching treatment. During this etching process, which is also carried out in a standard way by means of plasma etching on the basis of fluoridated ions diluted in argon, copper is locally pulverized, causing copper particles Cu to be deposited on a part of the vertical walls of the lower part 61 of the cavity 6. The thickness of the pulverized copper Cu layer has been exaggerated in FIG. 1c for clarity. These copper particles do not diffuse into the dielectric material 3 because of the presence of the protective layer 7.

Figure 1D:
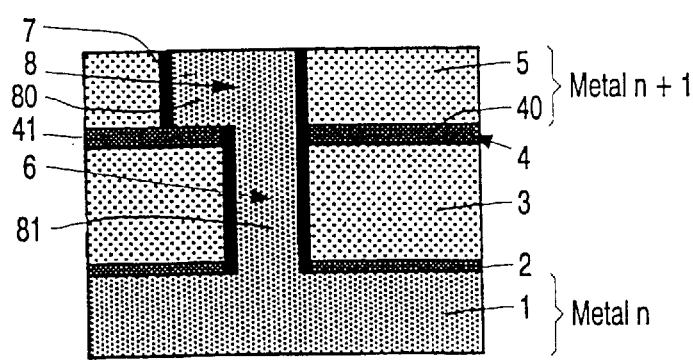

After providing a fine copper layer in a thickness of typically 130 nm by means of spray coating, which layer is not shown in the Figures for the sake of simplification, the cavity 6 is filled with copper by means of electrodeposition. It would alternatively be possible to employ chemical deposition in the vapor phase (CVD) in which case it would be unnecessary to pulverize a fine copper layer on the side walls of the cavity prior to filling said cavity. This finally results, as shown in FIG. 1d after mechano-chemical polishing, in a copper part 8 comprising the portion 80 of the metal track of level n+1 and of the via 81 interconnecting this portion 80 and the portion 1.

In the example described hereinabove use is made of titanium or titanium nitride for the protecting layer 7, however, it would also be possible to use tantalum or tantalum nitride. In that case, an anisotropic plasma-etching treatment would be employed the characteristics of which are the same as for the etching of titanium or titanium nitride.

FIGS. 2a through 2e show a method of carrying out the process when it is applied to an inverse dual damascene process. In these Figures, elements having the same structures and/or functions as those shown in FIGS. 1 through 1d bear the same reference numerals as those used in the FIGS. 1a through 1d. For the sake of simplification, only the differences between these two series of Figures are described hereinbelow.

The "inverse dual damascene" process differs from the "autoaligned dual damascene" process in that a nitride silicon stop layer 4 between the inter-level dielectric material and the inter-track dielectric material can be omitted. This has the advantage that the inter-level capacitance is reduced.

Figure 2A:
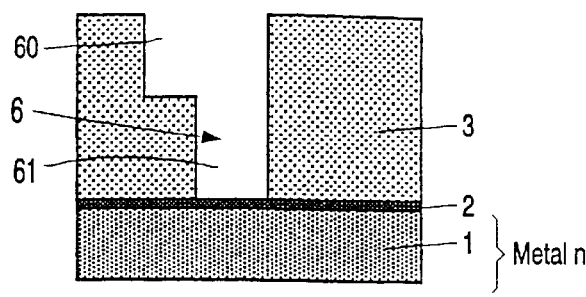
FIGS. 2a through 2e illustrate another method of carrying out the process in accordance with the invention, which is applicable, more particularly, to an "inverse dual damascene" type of process.
Figure 2B:
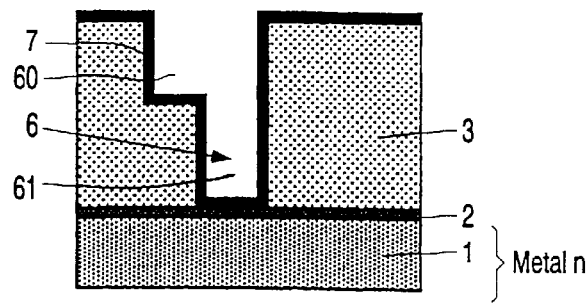
Figure 2C:
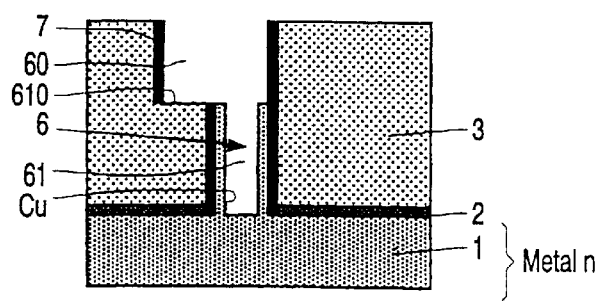

After the deposition of the protective layer 7 (FIG. 2b), and the subsequent anisotropic etching thereof as well as the etching of the encapsulation layer 2, the configuration shown in FIG. 2c is obtained. It is to be noted that as a result of anisotropically etching the protecting layer 7, the step 610 of the cavity 6 is exposed.

Figure 2D:
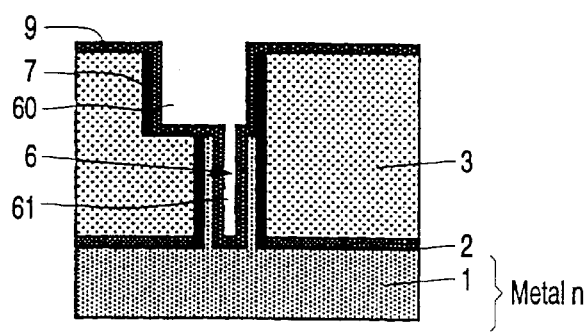
Figure 2E:
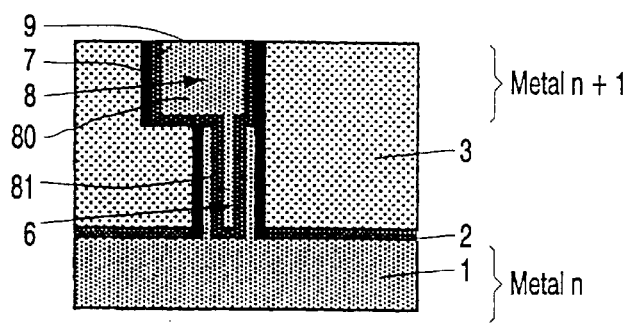
Figure 3A:
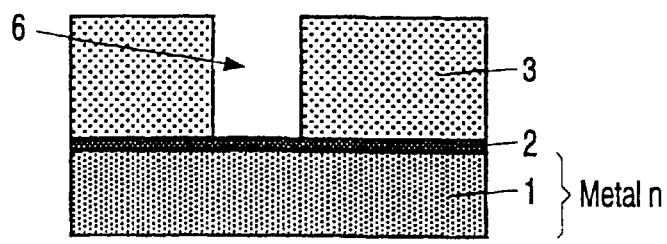
FIGS. 3a through 3d illustrate another variant of the process in accordance with the invention, which is applicable, more particularly, to a process of the "single damascene" type.
Figure 3B:
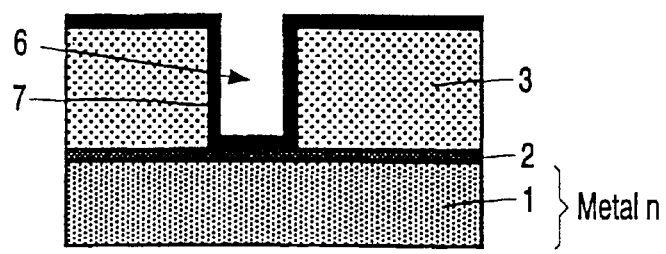
Figure 3C:
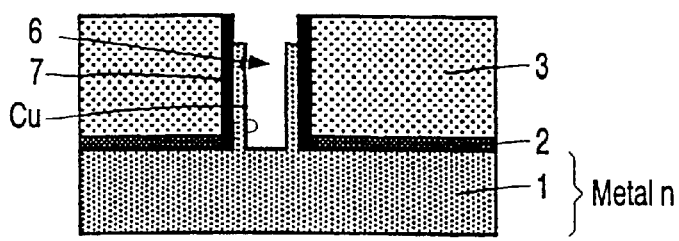
Figure 3D:
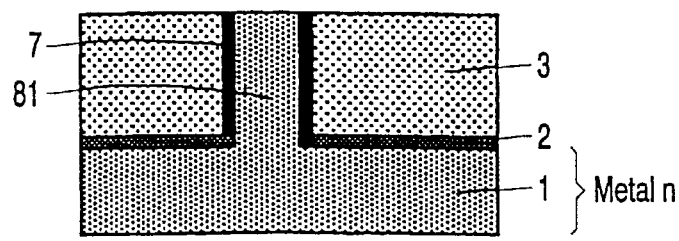

Therefore, it is necessary, before filling the cavity with copper, to deposit a second protective layer 9 which may consist of the same material as that used for the first layer 7 (FIG. 2d). This second protective layer enables the dielectric material situated at the level of the step 610 to be protected before filling the cavity 6 with copper. This precaution would not be necessary in the "autoaligned dual damascene" process because the presence of the portion 41 of the SiN stop layer forming a barrier would avoid contamination of the dielectric material by the copper during filling the cavity 6.

FIGS. 3a through 3d show, in a simplified manner, an embodiment of the invention which is compatible with a "simple damascene" process. Also in this case, elements which are analogous to those shown in FIGS. 1a through 1d, or fulfill an analogous function, bear the same reference numerals as the reference numerals used in these Figures. In the "simple damascene" process, the via is obtained by etching the inter-level dielectric 3. Next, the protective layer 7 is deposited which is subsequently anisotropically etched at the bottom of the cavity 6. Next, etching of the encapsulation layer 2 causes copper particles to be pulverized at this location which, by virtue of the presence of the layer 7, do not diffuse into the dielectric material. The via 81 is subsequently made by filling with copper, followed by mechano-chemical polishing. The level n+1 could then be formed, for example, by means of a single damascene process or a customary process other than a "damascene"-type process.

What is claimed is:

1. A method of manufacturing a vertical metal connection supported by a portion of a metallization level of an integrated circuit, wherein said portion is made of a conductive substrate material and being in direct contact with and covered by a side of an encapsulation layer, the method comprising the steps of:

depositing, on an opposite side of said encapsulation layer at least a first and second layer of a dielectric material, etching the first and second layers of dielectric material so as to from upper and lower portions of a cavity at the location of the future vertical connection, while leaving the encapsulation layer in tact, depositing at least one protective layer precluding diffusion of the conductive material in said cavity on an exposed surface of the first and second layers of the dielectric, wherein said protective layer directly contacts and covers at least a portion of the encapsulation layer, anisotropically etching (1) the protective layer at the bottom of the cavity in direct contact with the encapsulation layer, and (2) said at least a portion of the encapsulation layer, and filling the cavity with a conductive filler material, wherein an upper portion of the cavity forms a track and a lower portion forms a via that extends from an upper surface of the conductive substrate material to a lower portion of the track.

2. The method as claimed in claim 1, wherein the protective layer is composed of a material selected from the group consisting of: tantalum, tantalum nitride, titanium and titanium nitride.

3. The method as claimed in claim 1, wherein after etching the protective layer and the encapsulation layer at the bottom of the cavity, a second protective layer is deposited at the bottom and on the walls of the cavity.

4. The method as claimed in claim 1, wherein the conductive filler material is composed of a material selected from the group consisting of gold, gold alloys, aluminium and tuggsten.

* * * * *

UNITED STATES PATENT AND TRADEMARK OFFICE
CERTIFICATE OF CORRECTION

PATENT NO.    : 6,627,093 B1
DATED         : September 30, 2003
INVENTOR(S)   : Froment et al.

It is certified that error appears in the above-identified patent and that said Letters Patent is hereby corrected as shown below:

<u>Title page,</u>
Item [73], Assignee, after "Eindhoven (NL)" insert -- STMicroelectronics SA --.

Signed and Sealed this

Twentieth Day of July, 2004

JON W. DUDAS
*Acting Director of the United States Patent and Trademark Office*